United States Patent
Milkovich et al.

(10) Patent No.: US 6,516,513 B2
(45) Date of Patent: Feb. 11, 2003

(54) METHOD OF MAKING A CTE COMPENSATED CHIP INTERPOSER

(75) Inventors: Cynthia Susan Milkovich, Vestal, NY (US); Mark Vincent Pierson, Binghamton, NY (US); Charles Gerard Woychik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/092,117

(22) Filed: Mar. 5, 2002

(65) Prior Publication Data

US 2002/0088116 A1 Jul. 11, 2002

Related U.S. Application Data

(62) Division of application No. 09/665,365, filed on Sep. 19, 2000, now Pat. No. 6,339,892.

(51) Int. Cl.[7] .................................................. H05K 3/36
(52) U.S. Cl. .......................... 29/830; 29/831; 29/832; 174/255; 174/256; 361/790
(58) Field of Search ................................ 174/255, 200, 174/256, 254; 29/830, 831, 832; 361/792, 790

(56) References Cited

U.S. PATENT DOCUMENTS

| | | | |
|---|---|---|---|
| 4,349,862 A | 9/1982 | Bajorek et al. | 361/401 |
| 4,821,142 A | 4/1989 | Ushifusa et al. | 361/395 |
| 4,825,284 A | 4/1989 | Soga et al. | 357/80 |
| 4,937,707 A | 6/1990 | McBride et al. | 361/398 |
| 5,065,227 A | 11/1991 | Frankeny et al. | 357/74 |
| 5,189,507 A | 2/1993 | Carlomagno et al. | 257/777 |
| 5,313,366 A | 5/1994 | Gaudenzi et al. | 361/760 |
| 5,386,341 A | 1/1995 | Olson et al. | 361/749 |
| 5,474,458 A * | 12/1995 | Vafi et al. | 439/91 |
| 5,483,421 A | 1/1996 | Gedney et al. | 361/771 |
| 5,570,504 A * | 11/1996 | DiStefano et al. | 29/830 |
| 5,571,608 A | 11/1996 | Swamy | 428/246 |
| 5,682,061 A | 10/1997 | Khandros et al. | 257/666 |
| 5,796,591 A | 8/1998 | Dalal et al. | 361/779 |
| 5,841,194 A | 11/1998 | Tsukamoto | 257/729 |
| 5,842,273 A * | 12/1998 | Schar | 29/830 |
| 6,252,301 B1 * | 6/2001 | Gilleo et al. | 257/690 |
| 6,399,892 B1 * | 6/2002 | Milkovich et al. | 174/258 |

* cited by examiner

Primary Examiner—Albert W. Paladini
(74) Attorney, Agent, or Firm—Lawrence R. Fraley

(57) ABSTRACT

A multilayer CTE compensated chip interposer for connecting a semiconductor chip to a laminate chip carrier. A first dielectric layer, on the chip side of the interposer, is made of a stiff, high elastic modulus, material, such as a ceramic material, with a CTE closely matching the CTE of the chip. A second dielectric layer, on the laminate chip carrier side of the interposer, is made of resilient, low elastic modulus, material with metallurgy formed thereon, such as circuit board material, with a composite CTE closely matching the CTE of said chip carrier. A third dielectric intermediate layer, laminated between said first and second layers, is made of a low elastic modulus material with metallurgy formed thereon, such as a Teflon/glass particle material, with a composite CTE between the CTEs of said first and second layers.

13 Claims, 2 Drawing Sheets

METHOD OF MAKING A CTE COMPENSATED CHIP INTERPOSER

CROSS REFERENCE TO RELATED APPLICATION

Aspects of the present invention are related to subject matter disclosed in-co-pending application entitled "FLOATING INTERPOSER", Ser. No. 09/577,457, filed May 5, 2000, assigned to the assignee of the present invention.

CROSS REFERENCE TO COPENDING APPLICATION

This application is a divisional application of Ser. No. 09/665,365, filed Sep. 19, 2000, now U.S. Pat. No. 6,339,892.

BACKGROUND OF THE INVENTION

1. Field of the Invention

The present invention relates to an electrical interconnection arrangement for making connection between electronic devices. More particularly, the present invention relates to a multilayer interposer arrangement for making connection between semiconductor chip and laminate chip carrier.

2. Background and Related Art

One of the problems encountered with semiconductor chip connections to the next level of packaging is the high stress on the interconnections caused by coefficient of thermal expansion (CTE) mismatch. The CTE thermal mismatch is particularly large where the chip is connected to laminate chip carriers typically made of material similar to an epoxy circuit board material. As circuit densities in chips increase, so does the heat generated by these chips thereby compounding the problem with larger temperature variations in its thermal cycle. In addition, certain applications, such as flip chip applications, have required encapsulation to ensure a reliable flip chip interconnection in the solder joints. Such encapsulation typically employs a high strength epoxy which acts to bond the chip to the laminate chip carrier. This bonding of chip to chip carrier reduces solder joint stress during thermal cycling but causes the chip itself to be put under cyclical high internal stress eventually leading to chip cracking, delamination and device breakdown.

The above described high internal stresses on the chip are generally attributed to the fact that the bonding of chip to laminate chip carrier acts to cause this composite of materials to act like a "bimetallic" element wherein the composite bends upon heating due to the different CTE of the materials. As a result of the large thermal mismatch between chip and laminate chip carrier, the cyclical bending over time causes device failure. In this regard, the CTE for a typical semiconductor chip may be in the order of 3 micro inches per inch per degree Centigrade while a typical laminate chip carrier is around six times that amount. Thus, although the use of encapsulation is to prevent the C-4 connections from detaching due to fatigue and fracturing over thermal cycling, the bonding action of the encapsulation in itself acts to cause the chips to fracture and separate from the chip carrier.

In general, others have attempted to address the problems caused by CTE mismatch of materials in IC packaging by providing various interposing structures that attempt to compensate or reduce the mismatch of CTE. For example, two or more layers of materials with varying CTEs may be employed to form an interposing layer between one level of packaging and the next, with the layers having different CTEs such that the layer contacting one level of packaging is selected to have a CTE which more closely matches the CTE of that level while the layer contacting the next level of packaging has a CTE more closely matching that level. An example of such an arrangement is described in U.S. Pat. No. 5,386,341 to Olson, et al. The difficulty with arrangements, such as in Olson, et al., is that it is costly to fabricate and difficult to assemble, and does not readily lend itself to microminatization. In addition, various efforts have also been made to use interposing layers which are flexible in nature such as to reduce the stress on electrical interconnections during thermal cycling created by thermal mismatch. Examples of such an approach are taught in U.S. Pat. No. 4,937,707 to McBride, et al., and U.S. Pat. No. 5,362,656 to McMahon. However, as with Olson, et al. the difficulty with such approaches is they are costly to fabricate and do not readily lend themselves to microminatization.

SUMMARY OF THE INVENTION

In accordance with the teachings of the present invention, internal stresses in chips and their electrical interconnection caused by either CTE mismatch or encapsulation and bonding of chips to laminate chip carriers are overcome through the use of a multilayer CTE compensated interposer having an array of connectors extending therethrough and positioned between chip contacts and laminate chip carrier contacts. The multilayer CTE compensated interposer acts to provide both a signal and power redistribution chip carrier and CTE matching between chip and laminate carrier.

The CTE compensated interposer of the present invention comprises a three layer laminated arrangement of different materials with each layer having significantly different physical properties from the others. The interposer has a patterned array of conductive vias matching the array of C4 solder contacts on the chip and solder contacts on the laminate chip carrier. The top interposer layer, adjacent the chip, is made of a high elastic modulus stiff material, such as ceramic, which closely matches the CTE of the chip. The bottom interposer layer, adjacent the laminate, is made from a thin core material with layers of metallurgy formed thereon having a substantially lower elastic modulus than the top layer and a composite CTE that closely matches the CTE of the laminate. The layer intermediate the top layer and bottom layer is made of a core material with layers of metallurgy formed thereon that may have an even lower elastic modulus than the bottom layer and a composite CTE between the top and bottom layers. The high modulus, stiff, top layer will prevent bending which might otherwise occur with materials having differing CTEs laminated together. Since a close CTE match occurs between top layer and chip and bottom layer and laminate, little internal stress or fracturing due to thermal cycling occurs at the solder joint connections to these layers. If a low modulus intermediate layer is used, it may act to some degree as a shearable adhesive to provide the "give" or resiliance between top and bottom layers. The layers of metallurgy on the intermediate and bottom layers act to provide both a means of signal and power redistribution and a means to modify the CTE of the respective layers.

In one fabrication process, when plated vias of the interposer are aligned with C-4 solder balls on a flip chip die, upon heating the vias become filled with solder while becoming electrically connected to the chip die. The other ends of the vias are attached to the chip carrier laminate by a low melt solder.

Accordingly, it is an object of the present invention to provide an improved integrated circuit device package and method of making same.

It is another object of the present invention to provide improved electronic device interconnection and method of making same.

It is a further object of the present invention to provide improved electronic interconnection between semiconductor chip and chip carrier.

It is yet a further object of the present invention to provide an improved electronic interconnection between semiconductor chip and laminate chip carrier such as to reduce internal stress in both the chip and the electrical interconnections between chip and laminate chip carrier.

It is still yet a further object of the present invention to provide a CTE compensated interposer arrangement between chip and laminate chip carrier which allows the chip to be connected to the laminate chip carrier either with or without encapsulation of the interconnection points.

It is another object of the present invention to provide a method and apparatus for making electrical interconnection of chip directly to printed circuit board laminate.

It is yet another object of the present invention to provide an interposer arrangement of multiple layers of different materials having selected CTEs and elastic moduli arranged to reduce stress, cracking and delamination due to thermal mismatch.

It is still another object of the present invention to provide an interposer which functions as both CTE compensation means and signal and power redistribution means.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
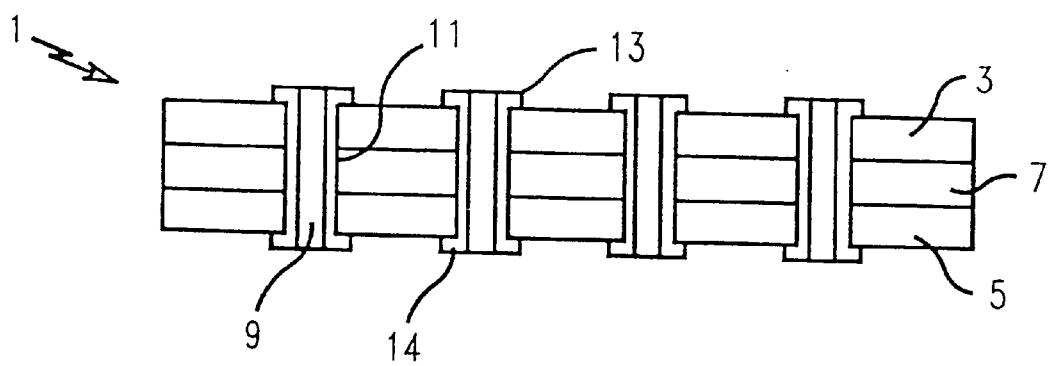
FIG. 1 shows a cross-sectional view of the multilayer CTE compensated chip interposer of the present invention.

With reference to FIG. 1, there is shown a cross-section of the multilayer CTE compensated chip interposer 1, in accordance with the present invention. For purposes of describing CTE compensation, FIG. 1 shows three layers identified as top layer 3, bottom layer 5 and intermediate layer 7. However, as will be described hereinafter, bottom layer 5 and intermediate layer 7 each also comprise multiple layers. Although reference has been made to top and bottom layers, it is to be understood the designations "top" and "bottom" are merely for convenience of description and do not designated any particular orientation in regard to mounting for packaging purposes. The layers could just as well been identified as first, second and third layers. As shown, the interposer has an array of vias 9 with walls plated with copper 11, for example. The vias terminate at opposing interposer surface with pads 13 and 14, which may also be copper, for example. The pattern of vias match the pattern of contact pads on the chip and laminate chip carrier. The term "chip carrier", as used herein, is intended to mean both chip carrier and circuit board.

In accordance with the present invention, top layer 3, bottom layer 5 and intermediate layer 7 are each made of dielectric materials having a different CTE, with the CTEs of top layer 3 and bottom layer 5 selected to closely match the CTEs of the nearest material. Thus, top layer 3, upon which a semiconductor chip is to be mounted, is selected from materials have a CTE closely matching the CTE of a semiconductor chip. In addition to being selected from materials having a CTE closely matching the CTE of a semiconductor chip, the material is selected from among relatively stiff materials, i.e., materials having a high elastic modulus. Materials suitable for this purpose are, ceramic material which has a CTE of around 5 PPM per degree C. and a modulus of around 53 Mpsi; glass which has a CTE of about 4 to 8 PPM per degree C. and a modulus of about 10 Mpsi; and silicon which has a CTE of about 3.4 PPM per degree C. and a modulus of about 16 Mpsi. Thus, materials having a range of CTEs between 3 and 8 PPM per degree C. and a range of elastic modulus between 10 and 55 Mpsi would be sufficient for this purpose. The thickness of layer 3 would typically be between 0.001 and 0.010 inches. Layer 3 may be prepunched or laser ablated to form a pattern of round vias, for example, that match the pattern of connection points on the semiconductor chip to be mounted.

Bottom layer 5 of CTE compensated chip interposer 1 is selected from an embedded core laminate material that closely matches the CTE of the chip carrier laminate upon which the chip, with interposer, is to be mounted. In addition, the material is selected from materials that are relatively soft and resilient compared to top layer 3, i.e., have a substantially lower modulus than top layer 3. In this regard, bottom layer 5 may preferably be made of printed circuit board (PCB) material which, when laminated with copper, has a composite CTE of about 18 PPM per degree C. and the resin, by itself, has a modulus of about 2 Mpsi. Typically, the organic dielectric PCB material itself is made of a fiberglass sheet impregnated with an epoxy resin, although other insulating materials, such as, polyimide, cynate, Kelvar, Teflon, etc. have also been used. Although PCB material alone has a CTE of around 60 PPM per degree C., when laminated with copper the composite structure has a CTE about that of copper, i.e. 18 PPM per degree C. Relatively flexible and resilient materials having an elastic modulus of about 1 to 3 Mpsi and, when laminated with a layer of metal, have a composite CTE within the range of about 15 to 20 PPM per degree C. are sufficient for this purpose.

Figure 2:
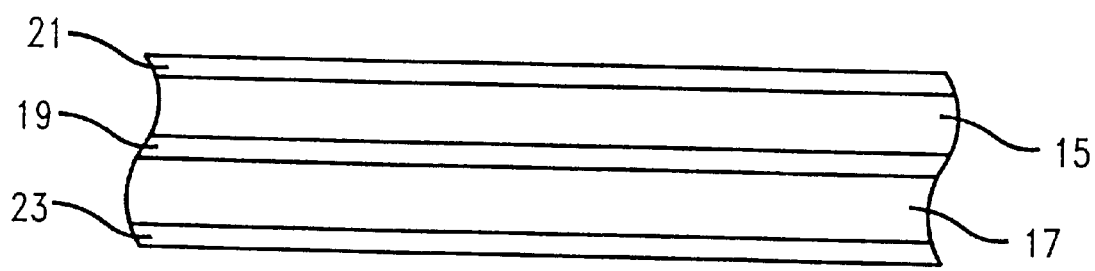
FIG. 2 shows an enlarged partial cross-sectional view of the bottom layer of the multilayer CTE compensated chip interposer of the present invention, as shown in FIG. 1.

An embedded core laminate structure that may be employed for the bottom layer 5 in FIG. 1, in accordance with the present invention, is shown in the enlarged cross-section of FIG. 2. This enlarged section is taken between vias 9. Insulating layers 15 and 17 may be made of PCB material, preferably fiberglass sheets impregnated with resins or epoxy which are thermosetting resins that act to form a chemical bond with metals. Positioned between insulating layers 15 and 17 is conductive layer 19 which is a selectively perforated sheet of copper which acts, for example, as a ground or power plane. The pattern of perforations or holes in conductive layer 19 align with and match pattern of holes prepunched in layer 3 but are larger in size. Conductive layers 21 and 23 are formed on the outer surface of insulating layers 15 and 17 and are selectively etched using standard techniques to form holes (where needed) similar in size and concentric with the perforations in the ground or reference plane and, if desired, circuit line patterns between vias for redistribution. The conductive layers 19, 21 and 23 may be sheets of copper foil (1 or 2 oz. for example) or other metals. The particular material and thickness or weight of the conductive layers is a matter of design choice and not intended to limit the present invention. In this regard, the particular material selected for the conductive layers and insulating layers will depend, to some degree, on the particular conductive and insulating materials used for the chip carrier. For example, where the chip carrier uses copper metallurgy on PCB, then use of copper for conductive layers 19, 21 and 23 on PCB provides a good match in composite CTEs. Again, the particular thickness of the PCB insulating layers is a matter of design choice but, typically, each layer would about 0.002 to 0.003 inches thick.

The conductive and insulating layers in FIG. 2 are laminated together with appropriate pressure and heat (to fully cure the resins) according standard practices, known to those skilled in the art. For example, where conductive layer 19 is a perforated copper sheet with a pattern of holes for vias positioned between PCB layers 15 and 17 which have full copper sheets for layers 21 and 23 on the outer surfaces thereof, then the lamination step may typically be carried out at a temperature between 180°–210° C. and a pressure between 250–600 psi for 1–2 hours. It should be noted that the pattern of holes in layer 19 correspond to the pattern of vias required to mate with the pattern of solder contacts on the chip. Accordingly, after lamination, copper layers 21 and 23 may then be selectively etched to form a pattern of holes for vias aligned with the holes in layer 19. It is understood that, where it is desired to form circuit line patterns between selected holes in conductive layers 21 and 23 for redistribution of signals or power, then the etched holes associated with redistribution are formed so as to connect with the redistribution circuit patterns.

Again, with reference to FIG. 1, intermediate layer 7 is selected from materials having a composite CTE intermediate the CTE of top layer 3 and composite CTE of the bottom layer 5. In addition, layer 7 is selected, in accordance with present invention, from material having a low elastic modulus which modulus may be even lower than that of bottom layer 5. For example, intermediate layer 7 may be made from a composition of Teflon and glass particles, such as, commercially available Rogers # 2800. Such material itself has a CTE of about 25 PPM per degree C. and a modulus of about 200 Kpsi. To obtain a CTE intermediate the CTE of top and bottom layers having the required low modulus, it would be sufficient to have a conductive/dielectric laminate material combination exhibiting a composite CTE in the range of about 9 to 14 PPM per degree C. and an elastic modulus in the range of about 50 Kpsi and 1 Mpsi.

Figure 3:
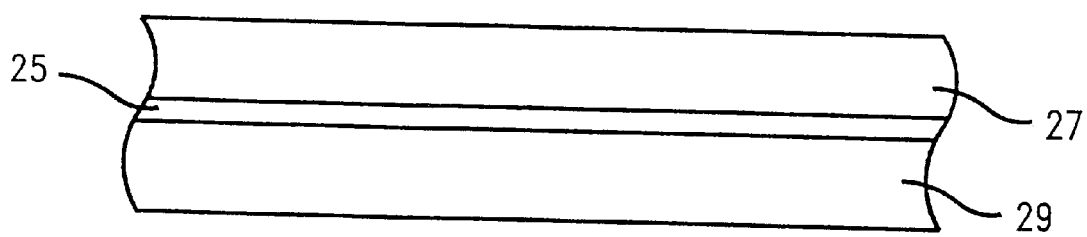
FIG. 3 shows an enlarged partial cross-sectional view of the middle layer of the multilayer CTE compensated chip interposer of the present invention, as shown in FIG. 1.

An embedded core laminate structure that may be employed for intermediate layer 7 in FIG. 1 is shown in the enlarged cross-section of FIG. 3. A conductive ground or reference plane 25 with holes, matching in size and location the holes in conductive layer 19, is positioned between insulating core layers 27 and 29. The conductive ground or reference plane 25 may be made of CIC (copper-invar-copper) and, as hereinabove mentioned, the insulating core layers 27 and 29 may be made of the Rogers # 2800 Teflon/glass particles. The Teflon/glass particle layers would typically be between 0.001 and 0.008 inches thick and the CIC would typically be between 1 and 2 oz. The composite CTE of the Rogers and CIC materials laminated together would be 10 PPM per degree C. Intermediate layer 7 may also be made of PCB material, similar to bottom layer 5, combined with CIC to give a composite CTE of around 10 PPM per degree C. The layers are formed and then laminated together using process steps with temperatures, pressures and times according to that described above with respect to layer 5. However, where Rogers 2800 and CIC materials are used in layer 7, the lamination temperature is between 300°–400° C. and the lamination pressure is between 1200–2200 psi for 1–2 hours. Also, where Rogers 2800 material is used, an additional layer of copper-based conductive material, for example, may be laminated on the outer surfaces of insulating layers 27 and 29 (similar to FIG. 2) to facilitate adhesion of layer 7 to layers 3 and 5 in the overall lamination process used to form the interposer. A pattern of holes for vias, matching in size and location the holes in conductive ground or reference plane 25, are selectively etched in these layers, as was done in the conductive layers 21 and 23 in layer 5.

In fabricating the CTE compensated interposer of FIG. 1, bottom layer 5 and intermediate layer 7 are each first formed as a composite laminate or embedded core structure, as hereinabove described. Then, top layer 3, intermediate layer 7 and bottom layer 5 are laminated together. A fiberglass sheet impregnated with epoxy or resin may be used between each of the layers for lamination purposes. It should be noted that the pattern of holes for vias formed in conductive layers 19, 21 and 23 in layer 5 and similar layers of metal in layer 7 are each first aligned with the pattern of holes prepunched in layer 3 (such as ceramic) before the lamination temperatures and pressures are applied. Typically, a temperature between 180–210° C. and a pressure between 250–600 psi for 1–2 hrs would be sufficient for lamination.

After lamination, a pattern of vias 9 is formed by punching or laser ablation through the prepunched holes in top layer 3 to remove the various layers of insulating material of the overall laminate interposer structure so as to thereby form interposer vias matching in size and location the prepunched holes in layer 3. Because the holes in layer 3 are smaller than those in the various layer of metallurgy, the holes punched in the layers of insulating material to form the vias are concentric with, but smaller in size than the holes in the various layers of metallurgy. The vias are then plated with copper, for example. As is clear, the resulting pattern of vias formed in the interposer is selected to match the pattern of connection points on the flip chip die and corresponding connection points on the laminated chip carrier. As is understood by those skilled in the art, there are a variety of other techniques that may be employed to form the array of vias in the interposer of the present invention. Copper plating may then be carried out by first plating all of the interposer 1 with electroless copper. A plating resist is then applied to the vias and both sides of the interposer. A mask is then aligned to retain resist in the vias and at sites surrounding the end of the vias so as to form top pads 13 and bottom pads 14 at the respective ends of the copper walls. Typically, the pads would be 4 mils in diameter. The resist is then exposed and developed, and the exposed copper on both sides is removed after which the resist is stripped off. Further plating may then be carried out.

It should be understood that although in the various embodiments described herein, reference is made to use of copper to form the walls and pads, it is clear that other metals, such as gold or nickel, may also be used in place of copper for plating the various vias and pads. The process for applying these metals is the same as that used for applying copper.

Although laminated layers of material having differing CTEs have a tendency to bend under thermal cycling, the high strength (high elastic modulus) ceramic material, for example, of top layer 3 of interposer 1 prevents significant bending. The more resilient, much lower modulus, material of bottom layer 5 flexes or gives rather than create forces to cause bending. The low modulus intermediate layer 7 also flexes or gives and provides a flexible adhesive interface between top layer 3 and bottom layer 5 and further provides a CTE value between the CTE value of these layers. For example, where top layer 3 is ceramic material with a CTE of about 5 PPM per degree C. (closely matching that of a silicon chip) and bottom layer 5 is an epoxy-based PCB material with a composite (including copper) CTE of about 18 PPM per degree C. (closely matching that of a laminate PCB), an intermediate layer of Teflon/glass particles provides a composite (including CIC) CTE of about 10 PPM per degree C. which is nearly the midpoint of the CTEs of the top and bottom layers. The Teflon/glass particle material also provides a very low modulus (200 Kpsi) and compliant interface material between top and bottom layers. It should also be noted that the laminated structures of layers 5 and 7 are each layered in symmetrical fashion. Thus, as can be seen, for example in FIG. 3, conductive layer 25 has a dielectric layer on each of its opposing sides. This symmetry of material layers reduces the tendency of these composite laminate layers to, themselves, bend during thermal cycling due to the different CTEs of the laminate materials.

Figure 4:
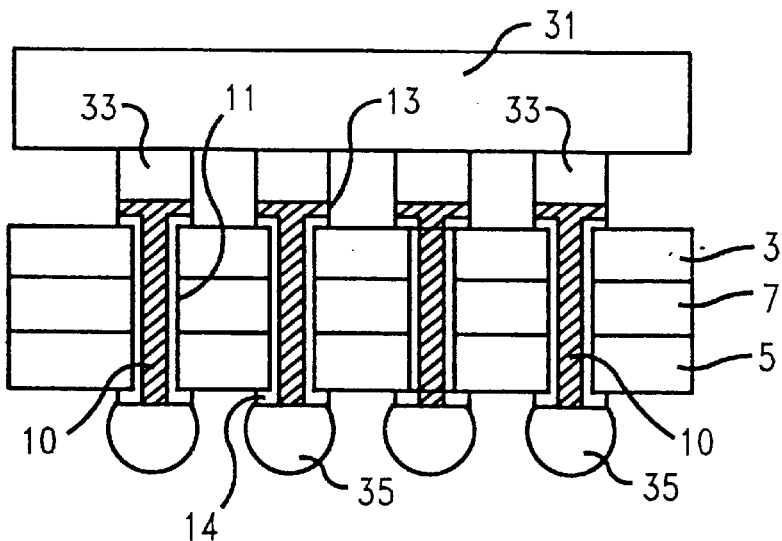
FIG. 4 shows a cross-sectional view of the multilayer CTE compensated chip interposer of the present invention with a chip mounted thereon.

FIG. 4 shows CTE compensated interposer of the present invention with chip 31 mounted thereon. Collapsed C4 solder balls 33, for example, connect chip pads (not shown) to interposer pads 13. Solder balls 35 are attached to interposer pads 14 for mounting to a laminate chip carrier. Use of a C4 solder balls connection process for connecting chip 31 to the interposer provides a way of filling plated vias 9 with solder 10 while making the connection.

Figure 5:
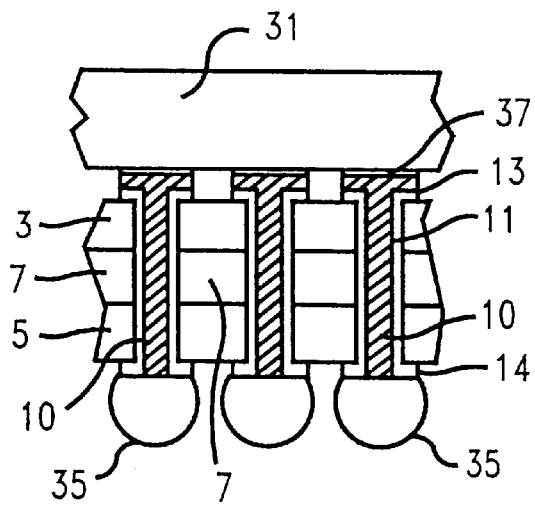
FIG. 5 shows a partial cross-sectional view of FIG. 4 depicting one embodiment of the manner in which the CTE compensated chip interposer of FIG. 1 may be attached to a chip.

This is achieved, as shown in the enlarged partial cross-sectional view of FIG. 5, by positioning interposer pads 13 against conventional corresponding medium melt (235–245° C.) C-4 solder bumps, previously attached to BLM pads 37 on chip die 31 in conventional manner. Upon heating, the high melt C-4 solder bumps collapse and solder is drawn through the respective vias 9 (with copper plated walls 11) to copper pads 14 on the bottom surface of the interposer so as to thereby form solder connectors. A solder stop layer may be temporarily positioned on the bottom surface of the interposer to limit the solder flow to the surface of pads 14. Thereafter the stop layer can be removed to expose pads 14. Alternatively, solder flow may be allowed to flow past the surface of pads 14 and, upon cooling, excess solder is trimmed flush with the surface pads. It should be noted that where polyimide or silicone based materials are used in bottom layer 5, a high melt solder (300–360° C.) may be used in the C-4 solder bumps.

Positioning interposer 1 in FIG. 5 against the high melt C-4 solder bumps on chip die 31 and heating the solder so that it is drawn through vias 9 acts to simply and effectively provide a means of electrically connecting chip die metallurgy to conductive pads 14 on the bottom surface of interposer 1, and this is achieved without damaging the underlying circuitry on the chip die. After cooling, conventional low melt (170–200° C.) solder balls 35 are attached to pads 14.

Figure 6:
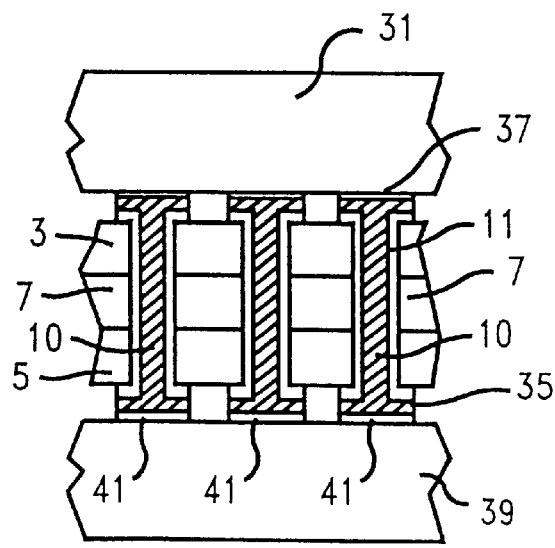
FIG. 6 shows a partial cross-sectional view of the manner for further connecting the CTE compensated chip interposer with attached chip of FIG. 5 to a laminate chip carrier.

FIG. 6 shows the manner in which the arrangement of FIG. 5 is attached to a laminate chip carrier 39. Low melt eutectic solder balls 35 in FIG. 5 are first aligned in contact with pads 41 on chip carrier 39. Upon heating, the solder balls melt and after cooling become soldered to pads 41. A significant advantage is achieved in using low melt solder balls to attach the chip die/interposer package to circuit card 33. In this regard, use of the low melt solder allows the chip die/interposer package to easily be removed from circuit card 33 in the event rework is required, and this is done without destroying the chip die/interposer package.

After connecting chip to interposer and interposer to laminate chip carrier, an epoxy fill may then be used to backfill remaining space between chip and interposer and interposer and carrier. Since the CTE of top layer 3 of the interposer closely matches that of chip 31, bonding top layer 3 to the chip does not cause bending during thermal cycling.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of making an interposer that compensates for CTE mismatch between a chip and a chip carrier, said method comprising the steps of:

forming a first layer of dielectric material having a first elastic modulus and a first CTE;

forming a second layer of dielectric material with metallurgy thereon having a second elastic modulus lower than said flat elastic modulus of said first layer of dielectric material and having a higher composite CTE than said CTE of said first layer of dielectric material;

forming a third layer of dielectric material with metallurgy thereon having a composite CTE between said first CTE of said first layer of dielectric material and said composite CTE of said second layer of dielectric material;

positioning said third layer of dielectric material between said first and second layers of dielectric material to form a composite structure; and forming an array of conductive vias through said composite structure.

2. The method as set forth in claim 1 wherein said first layer of dielectric material is formed having said first CTE between about 3 and about 8 ppm/° C.

3. The method as set forth in claim 2 wherein said first layer of dielectric material is formed having said first elastic modulus between about 10 and about 55 Mpsi so as to resist bending during thermal cycling.

4. The method as set forth in claim 1 wherein said second layer of dielectric material is formed having said composite CTE between about 15 and about 20 ppm/° C.

5. The method as set forth in claim 4 wherein said second layer of dielectric material is formed having said second elastic modulus between about 1 and about 3 Mpsi so as to flex during thermal cycling.

6. The method as set forth in claim 1 wherein said third layer of dielectric material is formed having said composite CTE between about 8 and about 15 ppm/° C.

7. The method as set forth in claim 6 wherein said third layer of dielectric material is formed having an elastic modulus of less than about 1 Mpsi so as to absorb thermal expansion differences between said first and second layers of dielectric material during thermal cycling.

8. The method as set forth in claim 1 wherein said step of forming said second layer of dielectric material with metallurgy thereon comprises the steps of:
   providing a layer of metallurgy having first and second surfaces;
   laminating a layer of dielectric material onto said first and second surfaces of said layer of metallurgy; and
   forming a pattern of conductive circuit lines within said layer of metallurgy.

9. The method as set forth in claim 1 wherein forming of said third layer of dielectric material with metallurgy thereon comprises forming a laminate of two layers of Teflon/glass particle material separated by said layer of metallurgy.

10. The method as set forth in claim 9 wherein said layer of metallurgy onto which said two layers of Teflon/glass particle material are laminated is comprised of copper-invar-copper.

11. The method as set forth in claim 10 wherein said laminating step is performed at a temperature of between about 300 and about 400° C. and at a pressure of between about 1200 and about 2200 psi for about 1 to about 2 hours.

12. The method as set forth in claim 1 wherein said positioning of said third layer of dielectric material between said first and second layers of dielectric material is accomplished by laminating.

13. The method as set forth in claim 12 wherein said laminating is performed at a temperature of between about 180 and about 210° C. and at a pressure of between about 250 and about 600 psi for about 1 to about 2 hours.

* * * * *